(12) United States Patent
Jing (10) Patent No.: US 9,618,778 B2
(45) Date of Patent: Apr. 11, 2017

(54) VACUUM CELL-ASSEMBLY DEVICE, CELL-ASSEMBLY METHOD AND MANUFACTURING DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventor: Yangkun Jing, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 311 days.

(21) Appl. No.: 14/381,148

(22) PCT Filed: Nov. 19, 2013

(86) PCT No.: PCT/CN2013/087403
§ 371 (c)(1),
(2) Date: Aug. 26, 2014

(87) PCT Pub. No.: WO2015/027576
PCT Pub. Date: Mar. 5, 2015

(65) Prior Publication Data
US 2016/0246081 A1    Aug. 25, 2016

(30) Foreign Application Priority Data
Aug. 30, 2013   (CN) .......................... 2013 1 0390793

(51) Int. Cl.
*B29C 65/48*     (2006.01)
*B32B 37/10*     (2006.01)
(Continued)

(52) U.S. Cl.
CPC ............ *G02F 1/1303* (2013.01); *B30B 15/06* (2013.01); *B32B 37/10* (2013.01);
(Continued)

(58) Field of Classification Search
USPC ....... 156/247, 249, 285, 288, 350, 351, 358, 156/560
See application file for complete search history.

(56) References Cited

U.S. PATENT DOCUMENTS

2008/0174076 A1* 7/2008 Eisele ................ B65G 47/1421
                                                                279/3
2011/0091391 A1* 4/2011 Ribi .................... A46B 15/0002
                                                                424/48
2016/0162079 A1* 6/2016 Jing ........................ G06F 3/045
                                                                345/174

FOREIGN PATENT DOCUMENTS

CN            202057930 U     11/2011

OTHER PUBLICATIONS

Written Opinion of the International Searching Authority dated May 30, 2014; PCT/CN2013/087403.

* cited by examiner

*Primary Examiner* — Sing P Chan
(74) *Attorney, Agent, or Firm* — Ladas & Parry LLP (57) ABSTRACT

A vacuum cell-assembly device, for cell-assembly of an upper substrate and a lower substrate of a display panel, includes an upper machine table, a lower machine table, a control circuit and a dynamic sensing and regulating structure. The dynamic sensing and regulating structure is fixed on the upper machine table and comprises a plurality of sub-structures. Each sub-structure comprises a flatness adjustment layer, a piezoelectric induction layer and a surface adsorption layer. Further disclosed are a cell-assembly method and a device for manufacturing a display panel.

(Continued)

The device can improve cell-assembly accuracy and cell-assembly quality.

19 Claims, 4 Drawing Sheets

(51) Int. Cl.
    *B32B 38/10*     (2006.01)
    *B32B 43/00*     (2006.01)
    *G02F 1/13*     (2006.01)
    *H01L 21/683*     (2006.01)
    *H01L 41/08*     (2006.01)
    *H01L 21/67*     (2006.01)
    *H01L 21/687*     (2006.01)
    *B30B 15/06*     (2006.01)
    *G02F 1/1335*     (2006.01)
    *G02F 1/1339*     (2006.01)
    *B32B 38/18*     (2006.01)

(52) U.S. Cl.
    CPC .......... *B32B 37/1018* (2013.01); *B32B 38/10* (2013.01); *H01L 21/67092* (2013.01); *H01L 21/67288* (2013.01); *H01L 21/6838* (2013.01); *H01L 21/6875* (2013.01); *H01L 41/0825* (2013.01); *B32B 38/1858* (2013.01); *B32B 2457/202* (2013.01); *G02F 1/1339* (2013.01); *G02F 1/133514* (2013.01)

VACUUM CELL-ASSEMBLY DEVICE, CELL-ASSEMBLY METHOD AND MANUFACTURING DEVICE

TECHNICAL FIELD

Embodiments of the present invention relate to a vacuum cell-assembly device, a cell-assembly method and a manufacturing device.

BACKGROUND

In the process of manufacturing a thin-film transistor liquid crystal display (TFT-LCD), vacuum cell-assembly is a core process in forming a cell. Vacuum cell-assembly refers to a process that: an array substrate (TFT) and a color filter (CF) substrate of a TFT-LCD are respectively adsorbed by an upper machine table and a lower machine table in a nearly vacuum environment, and adhered to each other after the upper machine table and the lower machine table move in opposite directions. The substrate adsorbed by the upper machine table can be referred to as an upper substrate, and the substrate adsorbed by the lower machine table may be referred to as a lower substrate. In the process of manufacturing another display, e.g., e-paper, an upper substrate and a lower substrate also must be subjected to vacuum cell-assembly.

With the development of the production line of LCD panels, the dimension of an LCD panel become larger and larger, and the requirements on the accuracy of the force applied to an upper substrate and the mode of separating the upper substrate become higher and higher as well. Currently, widely applied devices for adsorbing and separating the upper substrate mainly comprise silicon foam rubber chuck (SFC) devices and plate silicone rubber chuck (PSC) devices.

Figure 1:
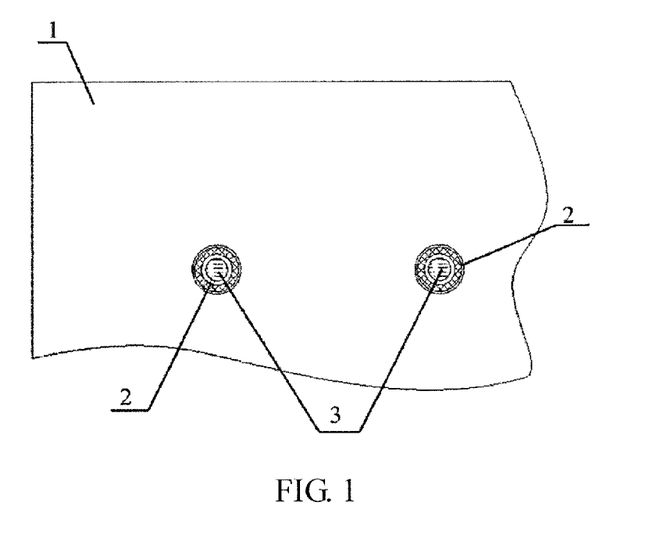
FIG. 1 is a schematic structural view of an upper machine table of a traditional SPF vacuum cell-assembly device.
Figure 2:
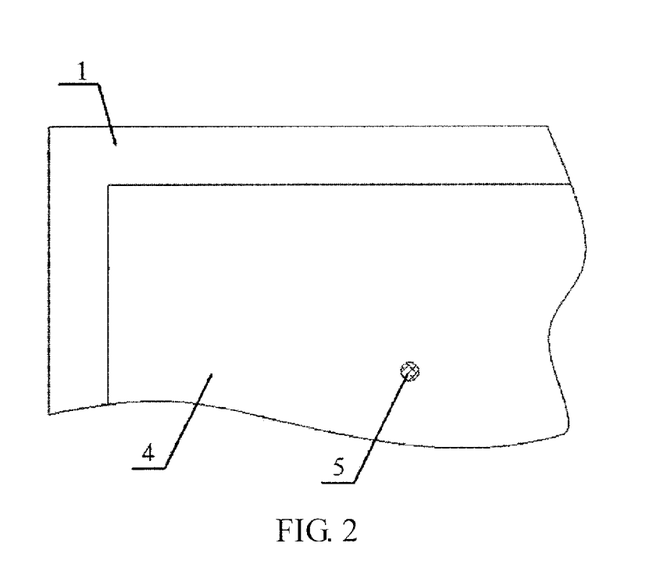
FIG. 2 is a schematic structural view of an upper machine table of a traditional PSC vacuum cell-assembly device.

As illustrated in FIG. 1, in an SFC device, an upper machine table 1 is provided with a plurality of circular SFC cohesive modules 2 which are configured to adsorb a substrate; when the substrate is separated from the cohesive modules 2, a computer controls the upper machine table 1 to move up and meanwhile controls air chambers 3 in the middle of the SEC cohesive modules 2 to be aerated and bulged so as to separate the substrate. In general, the number of the SFC cohesive modules 2 is more than 200. As illustrated in FIG. 2, in a PSC device, an upper machine table 1 is provided with large-area PSC cohesive modules 4 which are configured to adsorb an upper substrate; a pin 5 is disposed between the PSC cohesive modules 4 and the upper machine table 1; and when the substrate is separated from the cohesive modules 4, a computer controls the upper machine table 1 to move up and meanwhile controls the pin 5 to project down so as to separate the substrate. In general, the number of the PSC cohesive modules 4 is four.

However, because both the SFC device and the PSC device cannot sense the force applied to the upper substrate and the flatness of the upper substrate, the force applied to the upper substrate may be uneven in the process of applying pressure force to form the cell, and hence the upper substrate may be crushed or the cohesive state between the upper substrate and the lower substrate can be poor after the process of applying pressure force to form the cell, and consequently the cell-assembly accuracy and the cell-assembly quality can be affected.

SUMMARY

Embodiments of the present invention provide a vacuum cell-assembly device, a cell-assembly method and a manufacturing device, which are configured to improve cell-assembly accuracy and cell-assembly quality.

An embodiment of the present invention provides a vacuum cell-assembly device for cell-assembly of an upper substrate and a lower substrate of a display panel. The device comprises an upper machine table, a lower machine table, a control circuit and a dynamic sensing and regulating structure; the dynamic sensing and regulating structure is fixed on the upper machine table and comprises a plurality of sub-structures; and each sub-structure comprises a flatness adjustment layer, a piezoelectric induction layer and a surface adsorption layer in sequence from the top down.

For instance, each sub-structure corresponds to a sub-region of the upper substrate in position; in the cell-assembly process of the upper substrate and the lower substrate, the piezoelectric induction layer of each sub-structure generates a pressure-induced current corresponding to pressure according to the pressure applied to the sub-region of the upper substrate corresponding to the sub-structure, and the pressure-induced current is transmitted to the control circuit; the control circuit applies an electric field corresponding to the pressure-induced current to the flatness adjustment layer of the sub-structure, so that the flatness adjustment layer of the sub-structure produces deformation conformable with the corresponding sub-region of the upper substrate; the piezoelectric induction layer of each sub-structure generates a suction-induced current corresponding to suction according to the suction applied to the sub-region of the upper substrate corresponding to the sub-structure, and the suction-induced current is transmitted to the control circuit; and the control circuit controls a lowering speed of the upper machine table and the voltage applied to the surface adsorption layer of the sub-structure according to the suction-induced current, so that the surface adsorption layer of each sub-structure produces deformation corresponding to the voltage.

The control circuit applies an electric field corresponding to the pressure-induced current to the flatness adjustment layer of the sub-structure, so that the flatness adjustment layer of the sub-structure produces deformation conformable with the corresponding sub-region of the upper substrate, thereby compensating the flatness of the upper substrate and eliminating the uneven force phenomenon caused by the height difference of the surface of the upper substrate. Meanwhile, the control circuit controls the lowering speed of the upper machine table and the voltage applied to the surface adsorption layer of the sub-structure according to the suction-induced current, so that the surface adsorption layer of each sub-structure produces deformation corresponding to the voltage, and hence the force applied to the upper substrate become uniform and the cell-assembly accuracy and the cell-assembly quality are further improved.

For instance, the flatness adjustment layer is made of a piezoceramics material; the surface adsorption layer is made of a pressure-sensitive conductive rubber material; and the pressure-sensitive conductive rubber material is a flexible conductive composite material of which the electric resistivity is reduced as the applied pressure is increased.

For instance, the surface adsorption layer is deformed in the power-on state to form a plurality of chucks for adsorbing the upper substrate, which are configured to fix the upper substrate on the dynamic sensing and regulating structure.

For instance, a vacuum tube is disposed at a position in the surface adsorption layer, corresponding to a chuck, and configured to vacuumize an enclosed space formed by the chucks and the upper substrate, so that the adsorbing force applied to the upper substrate can be increased.

For instance, the piezoelectric induction layer of each sub-structure comprises: a first base substrate, a first sub-electrode disposed on the first base substrate, an intermediate medium layer disposed on the first sub-electrode, a second sub-electrode disposed on the intermediate medium layer, and a second base substrate disposed on the second sub-electrode; and a capacitor is formed by the first sub-electrode and the second sub-electrode. In the cell-assembly process of the upper substrate and the lower substrate, charges are produced when pressure is applied to the flatness adjustment layer, so that the electric quantity of the capacitor is changed, and hence pressure-induced current corresponding to the pressure is generated. When the suction applied to the upper substrate is changed, the pressure applied to the surface adsorption layer is changed. At this point, the electric resistivity of the surface adsorption layer of the sub-structure is changed, and hence suction-induced current corresponding to the suction is generated in the capacitor along with the change of the electric resistivity.

For instance, a plurality of sub-structures is arranged in an array; the first sub-electrode of each sub-structure is distributed along a first direction; a plurality of first sub-electrodes are combined to form a first electrode layer on the first substrate; the second sub-electrode of each sub-structure is distributed along a second direction; and a plurality of second sub-electrodes are combined to form a second electrode layer beneath the second base substrate.

For instance, the sub-structure may further comprise a piezoelectric sensing layer disposed between the piezoelectric induction layer and the surface adsorption layer and configured to transmit the pressure-induced current and the suction-induced current to the control circuit. Moreover, the piezoelectric sensing layer may also be replaced by a conductive connection wire.

For instance, the device further comprises a connection structure disposed between the upper machine table and the dynamic sensing and regulating structure and configured to fix the dynamic sensing and regulating structure on the upper machine table. The connection structure is beneficial for the replacement of the dynamic sensing and regulating structure as required. Moreover, the dynamic sensing and regulating structure may also be fixed on the upper machine table by bond, screw or clamp.

An embodiment of the present invention provides a device for manufacturing a display panel. The device for manufacturing the display panel comprises any one of the foregoing vacuum cell-assembly devices.

An embodiment of the present invention provides a cell-assembly method by utilization of the vacuum cell-assembly device, which comprises: loading the upper substrate and the lower substrate into the vacuum cell-assembly device in such a way that the upper substrate is adsorbed on a surface of the dynamic sensing and regulating structure; allowing the piezoelectric induction layer of each sub-structure to produce a pressure-induced current corresponding to pressure according to the pressure applied to the dynamic sensing and regulating structure by the corresponding sub-region of the upper substrate, transmitting the pressure-induced current to the control circuit, and allowing the control circuit to apply an electric field corresponding to the pressure-induced current to the flatness adjustment layer of the sub-structure, so that the flatness adjustment layer of the sub-structure produces deformation conformable with the corresponding sub-region of the upper substrate; vacuumizing the vacuum cell-assembly device and achieving the cell-assembly of the upper substrate and the lower substrate; allowing the upper substrate and the lower substrate to be subjected to the process of forming a cell by pressure, allowing the piezoelectric induction layer of each sub-structure to produce a suction-induced current corresponding to suction according to the suction applied to the corresponding sub-region of the upper substrate, transmitting the suction-induced current to the control circuit, and allowing the control circuit to control the lowering speed of the upper machine table and the voltage applied to the surface adsorption layer of the sub-structure according to the suction-induced current, so that the surface adsorption layer of each sub-structure produces deformation corresponding to the voltage; and separating the upper substrate and the dynamic sensing and regulating structure after the process of forming the cell by pressure is completed.

In the cell-assembly process by utilization of the method, the control circuit applies an electric field corresponding to the pressure-induced current to the flatness adjustment layer of the sub-structure, so that the flatness adjustment layer of the sub-structure produces deformation conformable with the corresponding sub-region of the upper substrate, thereby compensating the flatness of the upper substrate and eliminating the uneven force phenomenon caused by the height difference of the surface of the upper substrate. Moreover, the control circuit controls the lowering speed of the upper machine table and the voltage applied to the surface adsorption layer of the sub-structure according to the suction-induced current, so that the surface adsorption layer of each sub-structure produces deformation corresponding to the voltage, and hence the force applied to the upper substrate become uniform and the cell-assembly accuracy and the cell-assembly quality are further improved.

For instance, vacuum tubes are disposed at positions in the surface adsorption layer, corresponding to the chucks, so that the upper substrate is adsorbed on the surface of the dynamic sensing and regulating structure. Therefore, the method comprises: applying a forward voltage to the dynamic sensing and regulating structure in such a way that partial structure of the surface adsorption layer is recessed to form a plurality of chucks, and allowing the upper substrate to be adsorbed on the surface adsorption layer; and vacuumizing an enclosed space formed by the chucks and the upper substrate through vacuum tubes to increase the adsorbing force between the surface adsorption layer and the upper substrate. The upper substrate is adsorbed on the surface of the machine table, and the adsorbing force applied to the upper substrate is controlled by the control of the applied forward voltage, so that the upper substrate will not be disengaged from the surface of the upper machine table due to too small adsorbing force and will not be crushed due to too large adsorbing force.

For instance, a backward voltage is applied to the surface adsorption layer in such a way that the chucks for adsorbing the upper substrate disappear and the adsorbing force between the surface adsorption layer and the upper substrate is reduced; nitrogen is introduced by vacuum tubes and uniformly acts on a surface of the upper substrate in such a way that the upper substrate is separated from the surface adsorption layer. In the separation process, a backward voltage is applied to the dynamic sensing and regulating module in such a way that a recessed portion of the surface adsorption layer can be rapidly restored to the flat state; the chucks of the surface adsorption layer can disappear; and the adsorbing force between the surface adsorption layer and the upper substrate can be reduced. Meanwhile, gas is introduced through the vacuum tubes and uniformly acts on the surface of the upper substrate, so that the upper substrate can be rapidly separated from the surface of the upper machine table and the process of forming the cell by pressure can be more compact. Moreover, the gas is introduced after the process of forming the cell by pressure is completed, thereby further ensuring the vacuum state in a cell of the display panel obtained after the process of forming the cell by pressure, effectively avoiding the generation of nitrogen bubbles and vacuum bubbles, and improving the uniformity of a cell gap and the quality of the process of forming a cell by pressure. Meanwhile, by adoption of the method, the upper substrate is separated from the upper machine table, so that dark spots caused by the use of a pin can be avoided, and hence the quality of the display panel can be further improved.

BRIEF DESCRIPTION OF THE DRAWINGS

Simple description will be given below to the accompanying drawings of the embodiments to provide a more clear understanding of the technical proposals of the embodiments of the present invention. It will be obvious to those skilled in the art that the drawings described below only involve some embodiments of the present invention but are not intended to limit the present invention.

DETAILED DESCRIPTION

For more clear understanding of the objectives, technical proposals and advantages of the embodiments of the present invention, clear and complete description will be given below to the technical proposals of the embodiments of the present invention with reference to the accompanying drawings of the embodiments of the present invention. It will be obvious to those skilled in the art that the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

Embodiments of the present invention provide a vacuum cell-assembly device, a cell-assembly method and a manufacturing device, which are configured to improve cell-assembly accuracy and cell-assembly quality.

Figure 3A:
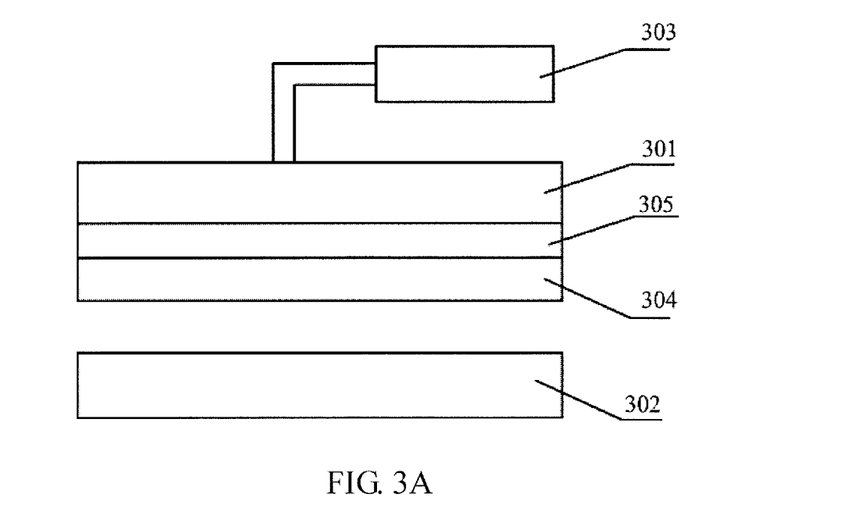
FIG. 3A is a schematic structural view of a vacuum cell-assembly device provided by an embodiment of the present invention.
Figure 3B:
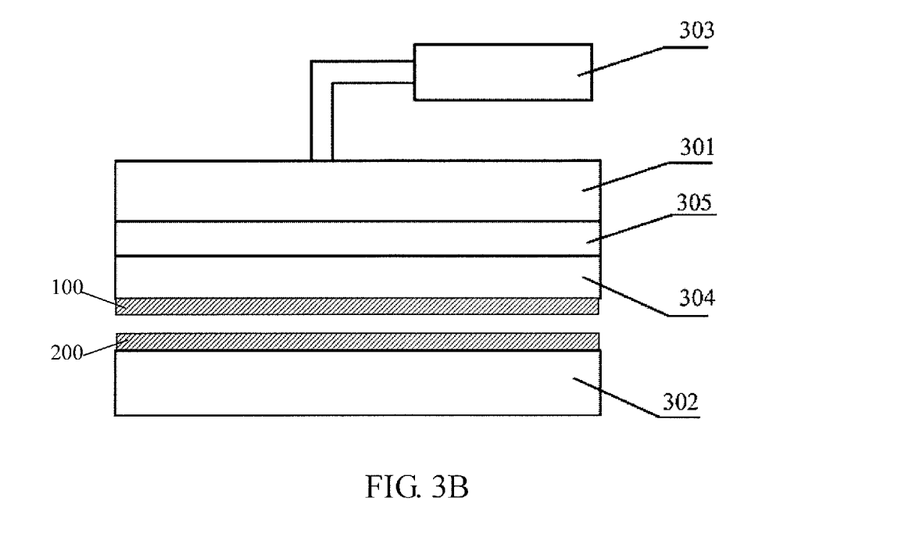
FIG. 3B is a schematic diagram illustrating the working state of the vacuum cell-assembly device provided by the embodiment of the present invention.
Figure 4:
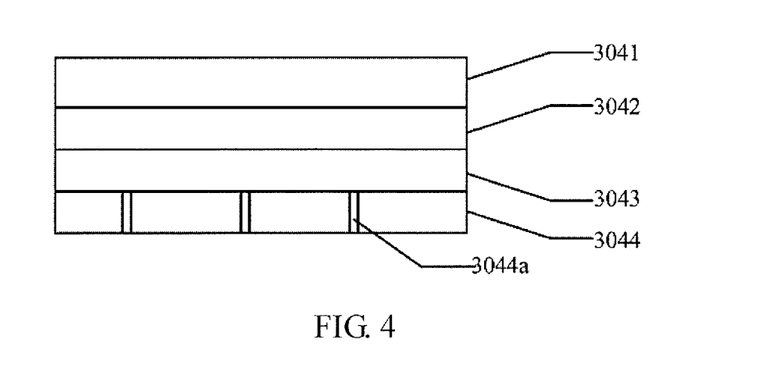
FIG. 4 is a schematic structural sectional view of a dynamic sensing and regulating structure.

An embodiment of the present invention provides a vacuum cell-assembly device which can be used for the cell-assembly of an upper substrate 100 and a lower substrate 200 of a display panel. As illustrated in FIGS. 3A, 3B and 4, the device comprises an upper machine table 301, a lower machine table 302 and a control circuit 303 for controlling the upper machine table 301 and the lower machine table 302 to achieve the cell-assembly of the upper substrate 100 and the lower substrate 200. One of the upper substrate 100 and the lower substrate 200 may be an array substrate of a liquid crystal display (LCD), and the other may be a CF substrate; and at least one of the upper substrate 100 and the lower substrate 200 is coated with a sealant. The upper substrate 100 and the lower substrate 200 respectively comprise a plurality of pixel regions and these pixel regions correspond to each other. The control circuit 303, for instance, may be a general control device (e.g., a central processing unit (CPU)) and may also be a dedicated control circuit (e.g., a digital signal processor (DSP)).

As illustrated in FIGS. 3A and 4, a dynamic sensing and regulating structure 304 is disposed on the upper machine table 301 and comprises a plurality of sub-structures arranged in an array; and each sub-structure corresponds to a sub-region (for instance, corresponding to one or more pixel regions) of the upper substrate 100 in position and comprises a flatness adjustment layer 3041, a piezoelectric induction layer 3042, a piezoelectric sensing layer 3043 and a surface adsorption layer 3044 in sequence from the top down.

In the cell-assembly process of the upper substrate 100 and the lower substrate 200, the piezoelectric induction layer 3042 of each sub-structure, according to the pressure applied to the sub-region of the upper substrate 100 corresponding to the sub-structure, generates a pressure-induced current corresponding to the pressure, and transmits the pressure-induced current to the control circuit 303. The control circuit 303 applies an electric field corresponding to the pressure-induced current to the flatness adjustment layer 3041 of the sub-structure, so that the flatness adjustment layer 3041 of the sub-structure produces deformation conformable with the corresponding sub-region of the upper substrate 100. Or the piezoelectric induction layer 3042 of each sub-structure, according to the suction applied to the sub-region of the upper substrate corresponding to the sub-structure, generates a suction-induced current corresponding to suction and transmits the suction-induced current to the control circuit 303. The control circuit 303 controls the lowering speed of the upper machine table 301 and the voltage applied to the surface adsorption layer 3044 of the sub-structure according to the suction-induced current, so that the surface adsorption layer 3044 of each sub-structure produces deformation corresponding to the voltage. Specific examples will be described below.

The flatness adjustment layer 3041 may be made of a piezoceramics material. The piezoceramics material is a kind of polycrystal obtained from the collection of irregular fine grains through the processes such as granulation, molding and high-temperature sintering after the raw materials of necessary ingredients are mixed, and may be barium titanate compounds, lead zirconate titanate binary compounds or the like. A piezoceramics material is deformed under the action of an external force or an external electric field, and charges of opposite electric properties is generated on the surfaces on two opposite sides corresponding to deformation. Therefore, in the cell-assembly process of the upper substrate and the lower substrate, when the upper substrate 100 is adsorbed on the dynamic sensing and regulating structure 304, the upper substrate 100 applies pressure to the dynamic sensing and regulating structure 304, and the flatness adjustment layer 3041 made of a piezoceramics material in each sub-structure is deformed under the action of the pressure, so that the adhesion between the upper substrate 100 and the dynamic sensing and regulating structure 304 is increased, and positive charges and negative charges are respectively generated on both sides of a deformed position. The positive charges and the negative charges are equal in electric quantity which corresponds to the deformation degree. However, because the deformation produced under the action of pressure is unstable, a certain electric field needs be applied to the deformed portion of the flatness adjustment layer 3041, so that the flatness adjustment layer 3041 in the structure can maintain the deformation under the action of the electric field.

Because the flatness adjustment layer 3041 and the piezoelectric induction layer 3042 make direct contact with each other, charges on the surface of the piezoelectric induction layer 3042 is changed due to the change of charges on the surface of the flatness adjustment layer 3041, and hence a pressure-induced current is generated in the piezoelectric induction layer 3042. The pressure-induced current is transmitted to the control circuit 303 through the piezoelectric sensing layer 3043. The control circuit 303 applies an electric field corresponding to the pressure-induced current to the flatness adjustment layer 3041 according to the received pressure-induced current, so that under the electric field the flatness adjustment layer 3041 can produce deformation conformable with the corresponding sub-region of the upper substrate, and maintain the deformation, thereby increasing the adhesion between the dynamic sensing and regulating structure 304 and the upper substrate, eliminating the uneven pressure phenomenon caused by the height difference on the surface of the upper substrate 100, and compensating the flatness of the upper substrate 100. For instance, the flatness adjustment layer 3041 may adjust the height within 50 micrometers.

Figure 5:
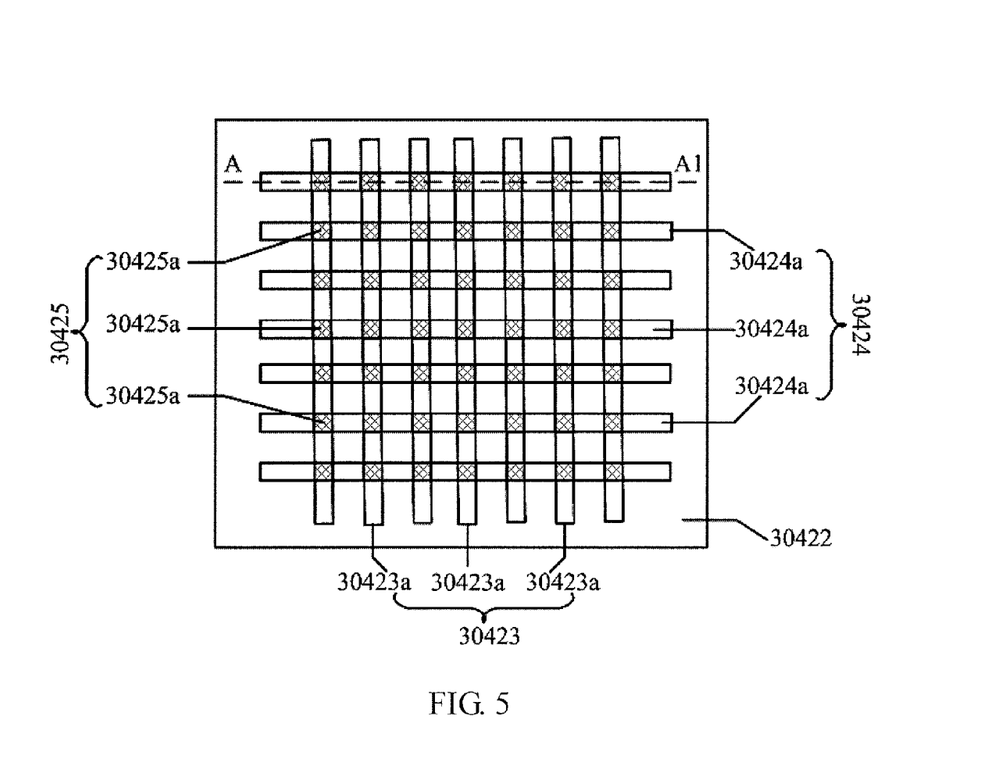
FIG. 5 is a schematic structural plan view of an example of a piezoelectric induction layer.
Figure 6:
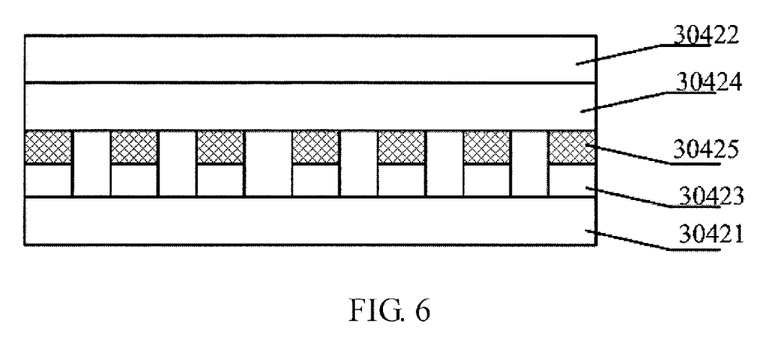
FIG. 6 is a schematic structural sectional view of the example of the piezoelectric induction layer in FIG. 5 along the A-A1 direction.

As illustrated in FIGS. 5 and 6, the piezoelectric induction layer 3042 is disposed beneath the flatness adjustment layer 3041. FIG. 5 is a schematic structural plan view of an example of the piezoelectric induction layer 3042, and FIG. 6 is a schematic structural sectional view of the example of the piezoelectric induction layer 3042 in the A-A1 direction in FIG. 5. As illustrated in FIGS. 5 and 6, the piezoelectric induction layer 3042 of each sub-structure comprises: a first base substrate 30421 and a second base substrate 30422 which are arranged in opposite directions, first sub-electrodes 30423a disposed on the first base substrate 30421 and facing the second base substrate 30422, second sub-electrodes 30424a disposed on the second base substrate 30422 and facing the first base substrate 30421, and an intermediate medium layer 30425 disposed between the first sub-electrodes 30423a and the second sub-electrodes 30424a.

A capacitor is formed by the first sub-electrodes 30423a and the second sub-electrodes 30424a. In the cell-assembly process of the upper substrate and the lower substrate, charges are produced after the flatness adjustment layer 3041 is pressed, so that the electrical quantity of the capacitor is changed, and hence pressure-induced current corresponding to the pressure is generated. When the suction applied to the upper substrate 100 is changed, the pressure applied to the surface adsorption layer 3044 is changed. At this point, the electric resistivity of the surface adsorption layer 3044 of the sub-structure is changed. Due to the change of the electric resistivity, the suction-induced current corresponding to the suction is generated in the capacitor.

The first sub-electrode 30423a of each sub-structure is distributed in a first direction, and a plurality of first sub-electrodes 30423a is combined to form a first electrode layer 30423 on the first base substrate 30421. The second sub-electrode 30424a of each sub-structure is distributed in a second direction, and a plurality of second sub-electrodes 30424a is combined to form a second electrode layer 30424 beneath the second base substrate 30422. For instance, the first direction refers to the transverse direction in the figure, and the second direction refers to the longitudinal direction in the figure. The first sub-electrodes 30423a and the second sub-electrodes 30424a may be made of a conductive metal material such as titanium, aluminum or the like.

The intermediate medium layer 30425 comprises a plurality of intermediate medium layer units 30425a distributed in an array and shaped in a rectangular pyramid. Each intermediate medium layer unit 30425a is disposed between the first sub-electrode 30423a and the second sub-electrode 30424a, so that the piezoelectric induction layer 3042 has good static and dynamic properties. The piezoelectric induction layer 3042 can well obtain touch information no matter from momentary touch or from continuous extrusion.

In the dynamic sensing and regulating structure 304, when a pressure-induced current or a suction-induced current is generated in a certain sub-structure, the position of the sub-structure can be determined by detecting corresponding coordinates of the first sub-electrodes 30423a and the second sub-electrodes 30424a. Therefore, the control accuracy of the control circuit 303 can be improved, and hence the cell-assembly accuracy can be improved accordingly.

The piezoelectric sensing layer 3043 is disposed beneath the piezoelectric induction layer 3042 and configured to transmit the pressure-induced current and the suction-induced current to the control circuit 303. The piezoelectric sensing layer 3043 may be also made of a piezoceramics material and can further improve the regulating capacity of the dynamic sensing and regulating structure 304 in the vertical direction. In this case, additional electrodes are also required for current transmission. Moreover, the piezoelectric sensing layer 3043 may also be made of another conductive material independently. Or the piezoelectric sensing layer 3043 may also be replaced by a conductive connection wire.

The surface adsorption layer 3044 is disposed beneath the piezoelectric sensing layer 3043 and configured to transmit both the pressure-induced current corresponding to the pressure applied to the dynamic sensing and regulating structure 304 by the upper substrate 100 and the suction-induced current corresponding to the suction applied to the upper substrate 100 to the control circuit 303.

The surface adsorption layer 3044 may be made of a pressure-sensitive conductive rubber material. The pressure-sensitive conductive rubber material may be formed by filling different carbon-based conductive materials (e.g., carbon black, graphite or carbon fiber) into silicone rubber or other polymer base materials. In the embodiment, carbon-black silicone rubber is adopted as the pressure-sensitive conductive material. The carbon-black silicone rubber is silicone rubber filled with carbon black; here the mass fraction of the carbon black is 8 percent. The pressure-sensitive conductive rubber material has elasticity. When the pressure is increased, the volume fraction of the rubber is reduced and the volume fraction of conductive particles is increased. The electric resistivity of the pressure-sensitive conductive rubber material will be reduced with the increase of the applied pressure.

The surface adsorption layer 3044 is deformed in the power-on state to form a plurality of chucks for adsorbing the upper substrate 100. In one example, vacuum tubes 3044a are disposed in the surface adsorption layer 3044 and configured to vacuumize an enclosed space formed by the chucks and the upper substrate 100, so that the adsorbing force between the chucks and the upper substrate 100 is further improved, and finally the upper substrate 100 is adsorbed on the surface of the surface adsorption layer 3044 in virtue of the adsorbing force completely.

After the upper substrate 100 is adsorbed on the surface of the surface adsorption layer 3044 in virtue of the suction completely, suction is applied to the upper substrate 100 by the surface adsorption layer 3044, and pressure corresponding to the suction is generated in the surface adsorption layer 3044. When the surface adsorption layer 3044 of each sub-structure is applied by the pressure, the electric resistivity is changed, so that the piezoelectric induction layer 3042 in the sub-structure produces a suction-induced current corresponding to the suction, and the suction-induced current is transmitted to the control circuit 303 through the piezoelectric sensing layer 3043. The control circuit 303 controls the lowering speed of the upper machine table 301 and the voltage applied to the surface adsorption layer 3044 of the sub-structure according to the suction-induced current, so that the surface adsorption layer 3044 of each sub-structure produces deformation corresponding to the voltage, and hence the force applied to the upper substrate 100 becomes more uniform. Therefore, the cell-assembly accuracy and the cell-assembly quality are improved. Meanwhile, the upper substrate 100 can be effectively prevented from being crushed, and hence the production safety can be further improved.

After the cell-assembly process of the upper substrate and the lower substrate is completed, the control circuit 303 applies a backward voltage to the surface adsorption layer 304 of each sub-structure; the chucks appearing on the surface adsorption layer 3044 rapidly disappear; the surface adsorption layer 3044 is restored to the flat state; and the suction applied to the upper substrate 100 is reduced. Meanwhile, inert gas such as nitrogen and argon is introduced through the vacuum tubes 3044a in the chucks, so that the upper substrate 100 is completely separated from the dynamic sensing and regulating structure 304. As the gas uniformly acts on the surface of the upper substrate 100 when the gas is introduced, the process of forming the cell by pressure can be more compact. Moreover, as the gas is introduced after the process of forming the cell by pressure is completed, the cell of the display panel obtained after the process of forming the cell by pressure can be further guaranteed to be in the vacuum state; the generation of nitrogen bubbles and vacuum bubbles can be effectively avoided; and the cell-gap uniformity and the quality of the process of forming the cell by pressure can be improved. Meanwhile, as the upper substrate 100 is separated from the dynamic sensing and regulating structure 304 by the method, dark spots caused by the use of a pin in the traditional technology can be avoided, and hence the quality of the display panel can be further improved.

Moreover, the dynamic sensing and regulating structure 304 may be not applied with the backward voltage but is only powered-off, so that the chucks can disappear automatically. Obviously, the automatic disappearance speed of the chucks is not faster than the disappearance speed after the backward voltage is applied.

Moreover, a connection structure 305 is disposed in the vacuum cell-assembly device and between the upper machine table 301 and the dynamic sensing and regulating structure 304, and is configured to fix the dynamic sensing and regulating structure 304 onto the surface of the upper machine table 301. The connection structure 305 may be a shaped permanent magnet pedestal or an electromagnet pedestal. The dynamic sensing and regulating structure 304 is fixed on the connection structure 305 by bond, screw or clamp, and hence fixed on the upper machine table 301 by utilization of the attraction between magnets in conjunction with an electromagnet structure on the upper machine table 301. When the dynamic sensing and regulating structure 304 are needed to be replaced, the dynamic sensing and regulating structure 304 can be removed by only applying a backward voltage to the electromagnet structure of the upper machine table 301 to generate a repulsive force between the two magnets.

It should be noted that the dynamic sensing and regulating structure 304 may also be directly fixed on the upper machine table 301 by bond, screw or clamp.

The embodiment of the present invention further provides a cell-assembly method by utilization of the vacuum cell-assembly device. The method may be as follows.

The upper substrate and the lower substrate are loaded into the vacuum cell-assembly device in such a way that the upper substrate is adsorbed on the surface of the dynamic sensing and regulating structure.

The piezoelectric induction layer of each sub-structure, according to the pressure applied to the dynamic sensing and regulating structure by the corresponding sub-region of the upper substrate, produces pressure-induced current corresponding to the pressure, and the pressure-induced current is transmitted to the control circuit. The control circuit applies an electric field corresponding to the pressure-induced current to the flatness adjustment layer of the sub-structure, so that the flatness adjustment layer of the sub-structure produces deformation conformable with the corresponding sub-region of the upper substrate.

The vacuum cell-assembly device is vacuumized so as to adsorb the substrates, and the upper substrate and the lower substrate are aligned.

The upper substrate and the lower substrate are subjected to cell-assembly. The piezoelectric induction layer of each sub-structure, according to the suction applied to the corresponding sub-region of the upper substrate, produces a suction-induced current corresponding to the suction, and the suction-induced current is transmitted to the control circuit. The control circuit controls the lowering speed of the upper machine table and the voltage applied to the surface adsorption layer of the sub-structure according to the suction-induced current, so that the surface adsorption layer of each sub-structure produces deformation corresponding to the voltage.

The upper substrate is separated from the dynamic sensing and regulating structure after the process of forming the cell by pressure is completed.

Detailed description will be given to the method for achieving the cell-assembly of the upper substrate and the lower substrate of the display panel with the vacuum cell-assembly device by taking the vacuum cell-assembly device provided by the embodiment of the present invention as an example. One example of the cell-assembly method may be as follows.

S1: loading the upper substrate and the lower substrate into a vacuum cavity of the vacuum cell-assembly device by employing a manipulator of a conveyer, placing the lower substrate on the lower machine table 302, and placing the upper substrate under the dynamic sensing and regulating structure 304.

S2: gradually lowering the upper machine table 301 until the upper substrate makes tight contact with the surface adsorption layer 3044 of the dynamic sensing and regulating structure 304 of the upper machine table 301; applying a forward voltage to the dynamic sensing and regulating structure 304 in such a way that a partial structure of the surface adsorption layer 3044 is recessed to form a plurality of chucks to adsorb the upper substrate on the surface adsorption layer 3044; vacuumizing an enclosed space formed by the chucks and the upper substrate with the vacuum tubes 3044a disposed in the surface adsorption layer 3044, so that the adsorbing force between the upper substrate and the surface adsorption layer 3044 can be further increased.

S3: allowing the flatness adjustment layer 3041 of each sub-structure to be deformed after being pressed; respectively producing positive charges and negative charges on surfaces on both sides of a deformed position; allowing the piezoelectric induction layer 3042 to produce a pressure-induced current corresponding to the pressure due to the increase of the charges, and transmitting the pressure-induced current to the control circuit 303; allowing the control circuit 303 to apply a corresponding electric field to the flatness adjustment layer 3041 according to the received pressure-induced current, so that the flatness adjustment layer 3041 of the sub-structure produces deformation conformable with the corresponding sub-region of the upper substrate and the flatness of the upper substrate is compensated, and hence the uneven pressure phenomenon caused by the height difference on the surface of the upper substrate is eliminated; and allowing the flatness adjustment layer 3041 to adjust the height within 50 micrometers.

S4: vacuumizing the vacuum cavity in such a way that the environment in the vacuum cavity is nearly in the vacuum state; and meanwhile aligning the upper substrate and the lower substrate by moving the position of the lower substrate with the lower machine table 302 in the horizontal direction according to images captured by a camera in the vacuum cell-assembly device.

S5: continuously and gradually pressing the upper machine table 301 after the cell-assembly process is completed, and performing the process of forming the cell by pressure of the upper substrate and the lower substrate.

In the process of forming the cell by pressure, after suction is applied to each sub-region of the upper substrate, corresponding pressure is applied to the surface adsorption layer 3044 of a corresponding sub-structure, and the electric resistivity of the surface adsorption layer 3044 is reduced along with the increased pressure. When the electric resistivity of the surface adsorption layer 3044 is changed, a suction-induced current corresponding to the suction is produced by the piezoelectric induction layer 3042 and transmitted to the control circuit through the piezoelectric sensing layer 3043. The control circuit 303 controls the lowering speed of the upper machine table 301 and the voltage applied to the surface adsorption layer 3044 of the sub-structure according to the suction-induced current, so that the surface adsorption layer 3044 of each sub-structure produces deformation corresponding to the voltage, and hence the force applied to the upper substrate become uniform. Meanwhile, the control circuit 303 compares the pressure with a predetermined upper pressure limit. If the pressure is more than or equal to the predetermined upper pressure limit, the upper machine table 301 is instructed to stop lowering so as to prevent the upper machine table from crushing the upper substrate.

S6: injecting inert gas such as nitrogen into the vacuum cavity to eliminate the vacuum state in the vacuum cavity after the process of forming the cell by pressure is completed.

S7: applying a backward voltage to the surface adsorption layer 3044, so as to restore the surface adsorption layer 3044 to the flat state, remove the chucks for adsorbing the upper substrate, and reduce the adsorbing force between the surface adsorption layer 3044 and the upper substrate; and meanwhile introducing nitrogen through the vacuum tubes 3044a, and allowing the gas to uniformly act on the surface of the upper substrate, so that the upper substrate is completely separated from the surface adsorption layer 3044.

S8: taking the display panel obtained after the cell-assembly process from the vacuum cell-assembly device with a manipulator.

An embodiment of the present invention further provides a device for manufacturing a display panel. The device for manufacturing the display panel comprises the foregoing vacuum cell-assembly device.

In summary, in the vacuum cell-assembly device provided by the embodiments of the present invention, in the process of forming the cell by pressure, the powered-on dynamic sensing and regulating structure can detect the flatness of the upper substrate, produce different deformation according to the different flatness, and compensate the flatness of the upper substrate, so that a uniform force is applied to the surface of the upper substrate and the uneven force phenomenon caused by the height difference on the surface of the upper substrate can be eliminated. Moreover, the dynamic sensing and regulating structure detects the suction applied to the upper substrate, produces the induced current corresponding to the suction, and transmits the induced current to the control circuit. The control circuit controls the lowering speed of the upper machine table and the suction applied to the upper substrate according to the induced current corresponding to the suction, so that a uniform force is applied to the upper substrate in the process of forming the cell by pressure; and meanwhile, the upper substrate can be prevented from being crushed. Therefore, the vacuum cell-assembly accuracy and the cell-assembly safety can be improved. Moreover, the upper substrate is separated from the upper machine table by applying the backward voltage to the sensing and regulating structure and blowing the upper substrate, so that the defects such as bubbles and dark spots can be greatly reduced.

The foregoing is only the preferred embodiments of the present invention and not intended to limit the scope of protection of the present invention. The scope of protection of the present invention should be defined by the appended claims.

The invention claimed is:

1. A vacuum cell-assembly device for cell-assembly of an upper substrate and a lower substrate of a display panel, comprising:
   an upper machine table;
   a lower machine table;
   a control circuit; and
   a dynamic sensing and regulating structure,
   wherein the dynamic sensing and regulating structure comprises a plurality of sub-structures and is fixed to the upper machine table; and
   wherein each of the plurality of sub-structures comprises in descending order a flatness adjustment layer, a piezoelectric induction layer and a surface adsorption layer.

2. The device according to claim 1, wherein:
   each of the plurality of sub-structures corresponds to a sub-region of the upper substrate in position;
   in a cell-assembly process of the upper substrate and the lower substrate, the piezoelectric induction layer of each sub-structure generates a pressure-induced current corresponding to a pressure applied to the sub-region of the upper substrate corresponding to the sub-structure, and the pressure-induced current is transmitted to the control circuit;

the control circuit applies an electric field corresponding to the pressure-induced current to the flatness adjustment layer of the sub-structure to produce deformation on the flatness adjustment layer, wherein the deformation on the flatness adjustment layer is conformable with the corresponding sub-region of the upper substrate;

the piezoelectric induction layer of each sub-structure generates a suction-induced current corresponding to a suction force applied to the sub-region of the upper substrate corresponding to the sub-structure, and the suction-induced current is transmitted to the control circuit; and the control circuit controls a lowering speed of the upper machine table and a voltage applied to the surface adsorption layer of the sub-structure according to the suction-induced current, wherein deformation corresponding to the voltage is produced on the surface adsorption layer of the sub-structure.

3. The device according to claim 2, wherein:
each of the plurality of sub-structures further comprises a piezoelectric sensing layer disposed between the piezoelectric induction layer and the surface adsorption layer; and
the piezoelectric sensing layer is configured to transmit the pressure-induced current and the suction-induced current to the control circuit.

4. The device according to claim 2, wherein:
the flatness adjustment layer is made of a piezoceramics material;
the surface adsorption layer is made of a pressure-sensitive conductive rubber material; and
the pressure-sensitive conductive rubber material is a flexible conductive composite material of which the electric resistivity is reduced as the applied pressure is increased.

5. The device according to claim 2, wherein the surface adsorption layer is deformed in a power-on state to form a plurality of chucks for adsorbing the upper substrate.

6. The device according to claim 5, wherein a corresponding vacuum tube is disposed at a position corresponding to each chuck on the surface adsorption layer.

7. The device according to claim 2, wherein:
the piezoelectric induction layer of each sub-structure comprises a first base substrate, a first sub-electrode disposed on the first base substrate, an intermediate medium layer disposed on the first sub-electrode, a second sub-electrode disposed on the intermediate medium layer, and a second base substrate disposed on the second sub-electrode; and
a capacitor is formed by the first sub-electrode and the second sub-electrode.

8. The device according to claim 7, wherein:
the plurality of sub-structures is arranged in an array;
a corresponding first sub-electrode of each of the plurality of sub-structures is distributed along a first direction;
a plurality of first sub-electrodes corresponding to the plurality of sub-structures are combined to form a first electrode layer on the first substrate;
a corresponding second sub-electrode of each of the plurality of sub-structures is distributed along a second direction; and a plurality of second sub-electrodes corresponding to the plurality of sub-structures is combined to form a second electrode layer beneath the second base substrate.

9. The device according to claim 2, further comprising a connection structure disposed between the upper machine table and the dynamic sensing and regulating structure, and the connection structure being configured to fix the dynamic sensing and regulating structure onto the upper machine table.

10. The device according to claim 1, wherein:
the flatness adjustment layer is made of a piezoceramics material;
the surface adsorption layer is made of a pressure-sensitive conductive rubber material; and
the pressure-sensitive conductive rubber material is a flexible conductive composite material of which the electric resistivity is reduced as the applied pressure is increased.

11. The device according to claim 1, wherein the surface adsorption layer is deformed in a power-on state to form a plurality of chucks for adsorbing the upper substrate.

12. The device according to claim 11, wherein a respective vacuum tube is disposed at a position corresponding to each chuck on the surface adsorption layer.

13. The device according to claim 1, wherein:
the piezoelectric induction layer of each sub-structure comprises a first base substrate, a first sub-electrode disposed on the first base substrate, an intermediate medium layer disposed on the first sub-electrode, a second sub-electrode disposed on the intermediate medium layer, and a second base substrate disposed on the second sub-electrode; and
a capacitor is formed by the first sub-electrode and the second sub-electrode.

14. The device according to claim 13, wherein:
the plurality of sub-structures is arranged in an array;
a corresponding first sub-electrode of each sub-structure is distributed along a first direction;
a plurality of first sub-electrodes corresponding to the plurality of sub-structures are combined to form a first electrode layer on the first substrate;
a corresponding second sub-electrode of each sub-structure is distributed along a second direction; and
a plurality of second sub-electrodes corresponding to the plurality of sub-structures is combined to form a second electrode layer beneath the second base substrate.

15. The device according to claim 1, further comprising a connection structure disposed between the upper machine table and the dynamic sensing and regulating structure, the connection structure being configured to fix the dynamic sensing and regulating structure onto the upper machine table.

16. A device for manufacturing a display panel, comprising the vacuum cell-assembly device according to claim 1.

17. A cell-assembly method using a vacuum cell-assembly device according to claim 1, comprising:
loading an upper substrate onto an upper machine table of the vacuum cell-assembly device and adsorbing the upper substrate onto a surface of a dynamic sensing and regulating structure;
loading a lower substrate onto a lower machine table;
producing, by a piezoelectric induction layer of each sub-structure, a pressure-induced current corresponding to a pressure applied to the dynamic sensing and regulating structure in a position corresponding to a sub-region of the upper substrate;

transmitting the pressure-induced current to a control circuit;

applying, by the control circuit, an electric field corresponding to the pressure-induced current to a flatness adjustment layer of the sub-structure to produce deformation on the flatness adjustment layer, wherein the deformation on the flatness adjustment layer is conformable with the corresponding sub-region of the upper substrate;

vacuumizing the vacuum cell-assembly device and performing alignment between the upper substrate and the lower substrate;

pressing the upper substrate and the lower substrate together to form a cell-assembly, wherein during formation of the cell-assembly the piezoelectric induction layer of each sub-structure produces a suction-induced current corresponding to a suction force applied to the corresponding sub-region of the upper substrate;

transmitting the suction-induced current to the control circuit;

controlling, by the control circuit, a lowering speed of an upper machine table and a voltage applied to a surface adsorption layer of the sub-structure based on the suction-induced current, wherein deformation corresponding to the voltage is produced on the surface adsorption layer of the sub-structure; and separating the upper substrate from the dynamic sensing and regulating structure after completion of forming the cell-assembly.

18. The method according to claim 17, comprising:

applying a forward voltage to the dynamic sensing and regulating structure to cause a partial structure of the surface adsorption layer to be recessed and form a plurality of chucks to adsorb the upper substrate onto the surface adsorption layer; and vacuumizing an enclosed space formed by the chucks and the upper substrate with vacuum tubes to increase an adsorbing force between the surface adsorption layer and the upper substrate.

19. The method according to claim 18, wherein:

a backward voltage is applied to the surface adsorption layer to cause the chucks for adsorbing the upper substrate to disappear and the adsorbing force between the surface adsorption layer and the upper substrate to be reduced; and nitrogen is introduced through the vacuum tubes and uniformly acts on a surface of the upper substrate to separate the upper substrate from the surface adsorption layer.

* * * * *